United States Patent
Park et al.

(10) Patent No.: US 8,673,110 B2
(45) Date of Patent: Mar. 18, 2014

(54) SOLUTION SUPPLYING UNIT AND SUBSTRATE TREATING APPARATUS HAVING THE SAME

(75) Inventors: Gui-Su Park, Chungcheongnam-do (KR); Hwan-lk Noh, Seoul (KR); Byung-Chul Kang, Chungcheongnam-do (KR); Won-Pil Cho, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 449 days.

(21) Appl. No.: 13/044,724

(22) Filed: Mar. 10, 2011

(65) Prior Publication Data

US 2011/0220286 A1    Sep. 15, 2011

(30) Foreign Application Priority Data

Mar. 12, 2010    (KR) .................. 10-2010-0022233

(51) Int. Cl.
C23F 1/08       (2006.01)
F15D 1/00       (2006.01)

(52) U.S. Cl.
USPC .................................... 156/345.11; 137/602

(58) Field of Classification Search
USPC ...................... 156/345.11; 137/602
See application file for complete search history.

(56) References Cited

U.S. PATENT DOCUMENTS

| | | | | |
|---|---|---|---|---|
| 6,793,769 B2 * | 9/2004 | Kajino et al. | ............ | 156/345.55 |
| 6,827,814 B2 * | 12/2004 | Taniyama et al. | ......... | 156/345.12 |
| 8,282,771 B2 * | 10/2012 | Song et al. | ............... | 156/345.55 |
| 2011/0220286 A1 * | 9/2011 | Park et al. | ................ | 156/345.11 |

FOREIGN PATENT DOCUMENTS

| | | |
|---|---|---|
| JP | 04-130505 | 1/1992 |
| JP | 06291098 | 10/1994 |
| JP | 07-234093 | 9/1995 |
| JP | 2009-016497 | 1/2009 |
| JP | 2009-231466 | 10/2009 |
| JP | 2009-302406 | 12/2009 |

OTHER PUBLICATIONS

Machine Generated English Translation of JP 2009-016497 published Jan. 22, 2009.*
Machine Generated English Translation JP 06-291098 published Oct. 18, 1994.*
Machine Generated English Translation JP 2009-231466 Oct. 8, 2009.*
Japanese Office Action dated May 29, 2011; for Japanese Pat. App. No. 2011-054052; 5 sheets.

* cited by examiner

*Primary Examiner* — Sylvia R MacArthur
(74) *Attorney, Agent, or Firm* — Daly, Crowley, Mofford & Durkee, LLP

(57) ABSTRACT

A solution supplying unit includes a body, a first supplying tube and a second supplying tube. The body includes a chamber having a substantially circular cross-section to receive a solution and an out-flowing part connected to the chamber to flow out the solution. The first supplying tube is disposed at a side of the body, tangentially connected to the chamber, and supplying a first solution into the chamber to rotate the first solution in the chamber. The second supplying tube has an end portion, and supplying a second solution into the chamber to mix the first solution with the second solution. The end portion is formed through the body and is adjacent to a central axis of the body.

11 Claims, 5 Drawing Sheets

SOLUTION SUPPLYING UNIT AND SUBSTRATE TREATING APPARATUS HAVING THE SAME

CROSS-REFERENCE TO RELATED APPLICATION

This application claims priority under 35 U.S.C. §119 to Korean Patent Application No. 2010-22233, filed on Mar. 12, 2010, the disclosure of which is incorporated by reference herein in its entirety.

BACKGROUND OF THE INVENTION

1. Technical Field

Example embodiments of the present invention relate to a solution supplying unit and substrate treating apparatus having the solution supplying unit. More particularly, example embodiments of the present invention relate to a solution supplying unit capable of removing a photoresist and a substrate treating apparatus having the solution supplying unit.

2. Discussion of the Related Art

Generally, a semiconductor photolithography process includes a photoresist coating, an exposing, a developing, an etching and a removing of a photoresist. Using the photoresist as a mask, the exposing, the developing and the etching are performed, and then the photoresist is removed.

Generally, various kinds of solutions are used to remove the photoresist, and the solution is provided to a substrate through a solution supplying unit. For example, the solution may be a mixture of sulfuric acid and hydrogen peroxide, and the solution may be mixed in the solution supplying unit.

The sulfuric acid and the hydrogen peroxide are rotated in the solution supplying unit to use turbulence in mixing the sulfuric acid and the hydrogen peroxide. However, since specific gravities of the sulfuric acid and the hydrogen peroxide are different from each other, the sulfuric acid and the hydrogen peroxide are hard to be mixed. In addition, due to the specific gravity and a centrifugal force of the sulfuric acid, the hydrogen peroxide is hard to be provided into the solution supplying unit.

Even if the hydrogen peroxide is provided into the solution supplying unit, bubbles are generated due to boiling in mixing the sulfuric acid and the hydrogen peroxide. A pressure inside of the solution supplying unit increases due to the bubbles and thus the solution is flowed out. Then, the pressure inside of the solution supplying unit decreases. Thus, an amount of the out-flowed solution is not uniform. In addition, the bubbles are flowed out with the solution. Thus, the amount of the out-flowed solution is hard to be accurately controlled.

SUMMARY OF THE INVENTION

Example embodiments of the present invention provide a solution supplying unit capable of mixing a solution uniformly to remove a photoresist and providing a constant amount of solution to a substrate.

Example embodiments of the present invention also provide a substrate treating apparatus having the solution supplying unit.

According to an example embodiment of the present invention, a solution supplying unit includes a body, a first supplying tube and a second supplying tube. The body includes a chamber having a substantially circular cross-section to receive a solution and an out-flowing part connected to the chamber to flow out the solution. The first supplying tube is disposed at a side of the body, tangentially connected to the chamber, and supplying a first solution into the chamber to rotate the first solution in the chamber. The second supplying tube has an end portion, and supplying a second solution into the chamber to mix the first solution with the second solution. The end portion is formed through the body and is adjacent to a central axis of the body.

In an example embodiment, the solution supplying unit may further include a rotating blocking part disposed in the out-flowing part to decrease a rotation of a mixed solution of the first and second solutions so that the mixed solution is prevented from being flowed out with the rotation.

In an example embodiment, the rotating blocking part is a plate having a plurality of through-holes.

In an example embodiment, the solution supplying unit may further include a branch tube connected to the out-flowing part and flowing out the mixed solution to be spaced apart from each other.

In an example embodiment, the solution supplying unit may have a plurality of out-flowing parts to prevent a mixed solution of the first and second solutions from being flowed out with a rotation.

In an example embodiment, the body may further include an exhaust part connected to the chamber and exhausting bubbles from the chamber to an upper portion of the chamber. The bubbles may be generated in mixing the first solution with the second solution.

In an example embodiment, the first solution may have a specific gravity larger than the second solution.

In an example embodiment, the first solution may be sulfuric acid, and the second solution may be hydrogen peroxide.

In an example embodiment, a first position of supplying the first solution through the first supplying tube may be higher than or substantially same as a second position of supplying the second solution through the second supplying tube.

In an example embodiment, a cross-sectional area of the first supplying tube may be larger than that of the second supplying tube.

According to another example embodiment of the present invention, a substrate treating apparatus includes a supporting part and a solution supplying unit. The supporting part supports a substrate on which a photoresist layer is formed. The solution supplying unit is disposed over the supporting part to supply a solution to the substrate. The solution removes the photoresist layer. The solution supplying unit includes a body, a first supplying tube and a second supplying tube. The body includes a chamber having a substantially circular cross-section to receive a solution and an out-flowing part connected to the chamber to flow out the solution. The first supplying tube is disposed at a side of the body, tangentially connected to the chamber, and supplying a first solution into the chamber to rotate the first solution in the chamber. The second supplying tube has an end portion, and supplying a second solution into the chamber to mix the first solution with the second solution. The end portion is formed through the body and is adjacent to a central axis of the body.

According to the present invention, the hydrogen peroxide is provided through the second supplying tube which extends to an inside of the chamber. Thus, when the hydrogen peroxide is provided, the hydrogen peroxide is less affected by a specific gravity and a centrifugal force of the sulfuric acid which is rotated inside of the chamber.

In addition, the sulfuric acid and the hydrogen peroxide are uniformly mixed due to the difference between specific gravities of the sulfuric acid and the hydrogen peroxide and the turbulence caused by a collision between the sulfuric acid and the supplying unit.

In addition, the bubbles generated in mixing the sulfuric acid and the hydrogen peroxide exhaust through an exit of the solution supplying unit. The solution supplying unit supplies a mixed solution of the sulfuric acid and the hydrogen peroxide to the substrate through an exhaust. Thus, the amount of an exhausted solution may be accurately controlled.

In addition, the solution supplying unit exhausts the mixed solution which is not rotated using a rotating blocking part, and thus, the mixed solution may be prevented from being scattered.

BRIEF DESCRIPTION OF THE DRAWINGS

The above and other features of the present invention will become more apparent by describing in detail example embodiments thereof with reference to the accompanying drawings, in which.

DETAILED DESCRIPTION OF EXAMPLE EMBODIMENTS

Figure 1:
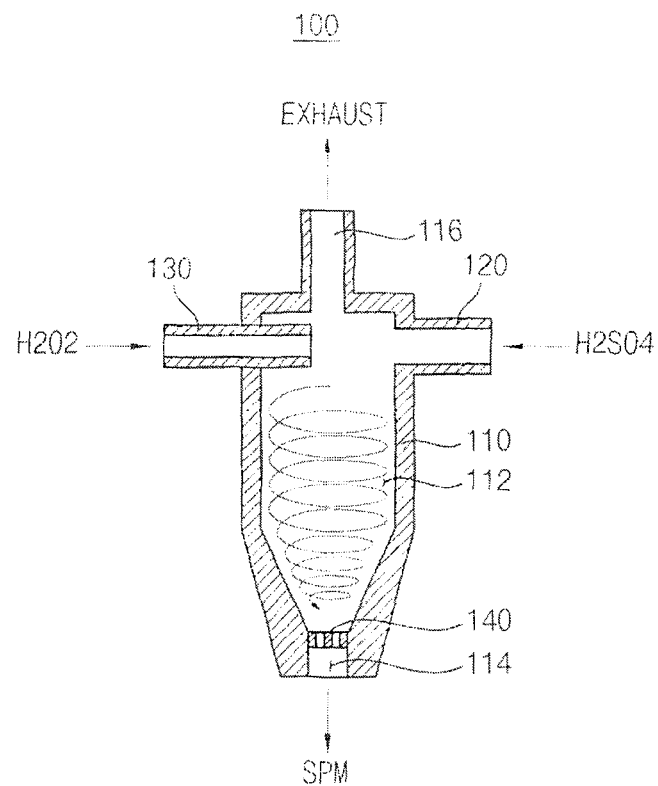
FIG. 1 is a side cross-sectional view illustrating a solution supplying unit according to an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
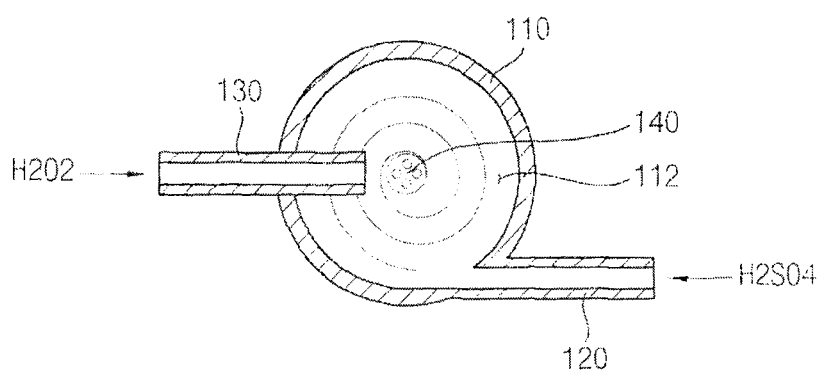
FIG. 2 is a plan cross-sectional view illustrating the solution supplying unit in FIG. 1.

FIG. 1 is a side cross-sectional view illustrating a solution supplying unit according to an example embodiment of the present invention. FIG. 2 is a plan cross-sectional view illustrating the solution supplying unit in FIG. 1.

Referring to FIG. 1 and FIG. 2, the solution supplying unit 100 includes a body 110, a first supplying tube 120, a second supplying tube 130 and a rotating blocking part 140. The solution supplying unit 100 provides a solution for treating a substrate to the substrate.

The body 110 includes a chamber 112 in which the solution is mixed. The chamber 112 has a circular cross-section. For example, the chamber may have a cone shape. A cross-sectional area of the chamber decreases from top to bottom. Alternatively, the chamber may have a cylindrical shape. A cross-sectional area of the chamber is constant.

The body 110 includes an out-flowing part 114 connected to the chamber 112 and disposed under the body 110. The out-flowing part 114 flows out the solution from the chamber 112 into a lower portion of the chamber 112.

For example, a cross-section of the out-flowing part 114 may be smaller than that of the chamber 112. Thus, an out-flowing speed of the solution may be increased through the out-flowing part 114.

The body 110 includes an exhaust part 116 connected to the chamber 112 and disposed on the body 110. The exhaust part 116 exhausts bubbles from the chamber to outside. The bubbles are lighter than the solution, so that the bubbles rise upwardly and are naturally exhausted through the exhaust part 116.

The first supplying tube 120 is disposed at a side of the body 110, and tangentially connected to the chamber 112. The first supplying tube 120 provides a first solution into the chamber 112.

The chamber 112 has a circular cross-section, and the first supplying tube 120 is tangentially connected to the chamber 112. Thus, the first solution provided by the first supplying tube 120 is rotated along an inside wall of the chamber 112.

The second supplying tube 130 extends to the chamber 112 through the body 110. Thus, the second supplying tube 130 protrudes from an inside wall of the body 110 into the chamber 112. The second supplying tube 130 may extend from the chamber 112 to a central axis of the chamber 112 or to a space between the central axis and the inside wall of the body 110. Thus, an end portion of the second supplying tube 130 is adjacent to the central axis. For example, as illustrated in FIG. 1 and FIG. 2, the second supplying tube 130 may penetrate a side of the body 110. Alternatively, the second supplying tube 130 may penetrate an upper portion of the body 110.

The second supplying tube 130 provides a second solution into the chamber 112. The first solution has a specific gravity larger than or substantially same as the second solution. Examples of materials for the first solution may include sulfuric acid ($H_2SO_4$), and examples of materials for the second solution may include hydrogen peroxide ($H_2O_2$). A mixture of the first and second solutions is sulfuric acid peroxide mixture ("SPM").

When the first solution is sulfuric acid and the second solution is hydrogen peroxide, the mixture of the first and second solutions is boiled by a chemical reaction. In addition, the boiling generates bubbles in the chamber 112. The bubbles are lighter than the mixed solution, so that the bubbles rise and are naturally exhausted through the exhaust part 116. Thus, the bubbles may be simply exhausted from the chamber 112.

The bubbles are exhausted through the exhaust part 116, and thus, a pressure in the chamber 112 may be prevented from being changed due to the bubbles. Thus, an amount of the mixed solution flowed out through the out-flowing part 114 may be constantly maintained.

In addition, the bubbles are exhausted through the exhaust part 116, not through the out-flowing part 114. Thus, the mixed solution may be flowed out without the bubbles through the out-flowing part 114, and the amount of the mixed solution flowed out through the out-flowing part 114 may be accurately controlled.

A first position of supplying the first solution through the first supplying tube 120 may be substantially same as a second position of supplying the second solution through the second supplying tube 130. For example, when the second supplying tube 130 penetrates a side of the body 110, the first supplying tube 120 may be substantially parallel with the second supplying tube 130, substantially perpendicular to the second supplying tube 130, or neither parallel with nor perpendicular to the second supplying tube 130.

When the second supplying tube 130 does not protrude into the chamber 112 through the body 110, the second solution is blocked to be supplied due to a specific gravity and a centrifugal force of the first solution. In addition, when the second supplying tube 130 is tangentially connected to the body 110, the second solution is provided to the inside wall of the body 110. Since the second solution rotates along the inside wall of the body 110 due to the centrifugal force of the first solution, the first and second solutions are not easily mixed.

However, the second solution is provided to a central axis of the chamber 112 or to a space between the central axis and the inside wall of the body 110 through the second supplying tube 130. Therefore, the second solution may be provided into the chamber 112 without being affected by the specific gravity and the centrifugal force of the first solution. In addition, the second solution may move to the inside wall of the body 110 due to the centrifugal force of the first solution, and thus, the second solution may be easily mixed with the first solution.

In addition, the second solution collides with the second supplying tube 130 when the second solution rotates. A collision between the second solution and the second supplying tube 130 makes turbulence, and the turbulence make the first and second solutions be mixed with each other much easier.

A cross-sectional area of the second supplying tube 130 may be substantially same as or smaller than a cross-sectional area of the first supplying tube 120. For example, a ratio of the cross-sectional area of the second supplying tube 130 to the cross-sectional area of the first supplying tube 120 may be about 1:4. When the cross-sectional area of the second supplying tube 130 is smaller than the cross-sectional area of the first supplying tube 120, a supplying pressure of the second solution may have larger than a supplying pressure of the first solution. Thus, even though the specific gravity of the second solution is smaller than that of the first solution and the amount of the supplied second solution is smaller than that of the supplied first solution, the second solution may be easily provided into the chamber 112 in which the first solution is included.

In addition, when the chamber 112 has the cone shape, a cross-sectional area of the chamber 112 decreases from top to bottom. Thus, a rotating speed of the first and second solutions increases from top to bottom. Thus, the first and second solutions may be mixed with each other more uniformly.

When the first solution and the second solution are flowed out through the out-flowing part 114 in rotating, the mixed solution may be scattered. The rotating blocking part 140 is disposed in the out-flowing part 114. The rotating blocking part 140 decreases the rotation of the mixed solution flowed out through the out-flowing part 114, to prevent the mixed solution from being scattered.

For example, the rotating blocking part 140 may include a plate having a plurality of through-holes as illustrated in FIG. 1 and FIG. 2. Since a cross-sectional area of each of the through-holes is smaller than that of the out-flowing part 114, the mixed solution collides with the plate when passing through the through-holes. Thus, the rotation of the mixed solution may be decreased.

Although not shown in the figures, the rotating blocking part may include a plurality of plates being alternately disposed on the inside wall of the out-flowing part 114. The plates may be disposed substantially perpendicular to an out-flowing direction of the mixed solution or have a predetermined inclination with the out-flowing direction of the mixed solution. Thus, when the mixed solution passes through the plates, the mixed solution may collide with the plates and the rotation of the mixture may be decreased.

Figure 3:
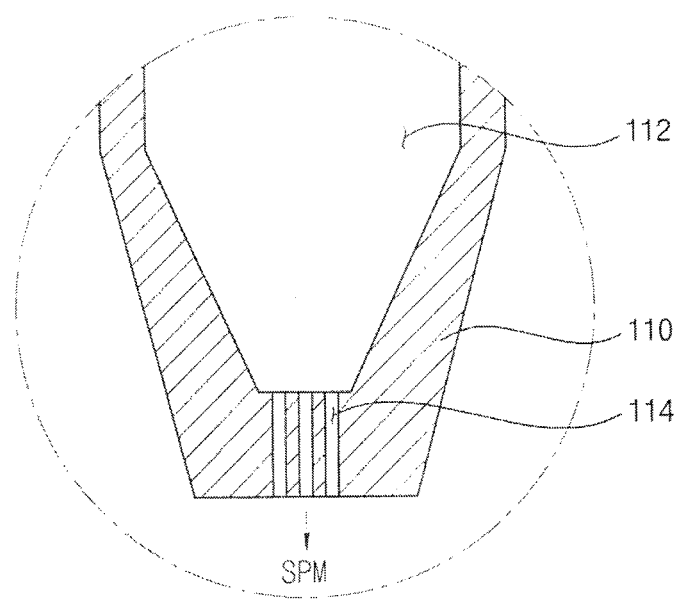
FIG. 3 is an enlarged cross-sectional view illustrating an out-flowing part according to another example embodiment of the present invention.

FIG. 3 is an enlarged cross-sectional view illustrating an out-flowing part according to another example embodiment of the present invention.

Referring to FIG. 3, the solution supplying unit according to the present example embodiment may include a plurality of out-flowing parts 114 without the rotating blocking part. A cross-sectional area of each of the out-flowing parts 114 is much smaller than that of the chamber 112. When the mixed solution flows from the chamber 112 into the out-flowing part 114, the mixed solution collides with a portion of the body 110 which forms the out-flowing part 114. Thus, the rotation of the mixed solution may be decreased.

As mentioned above, the second solution is less affected by the centrifugal force of the first solution, the second solution may be easily provided to the chamber 112. Therefore, the first and second solutions may be uniformly mixed. In addition, the mixed solution is flowed out without the rotation through the out-flowing part 114. Thus, the mixed solution may be prevented from being scattered.

Figure 4:
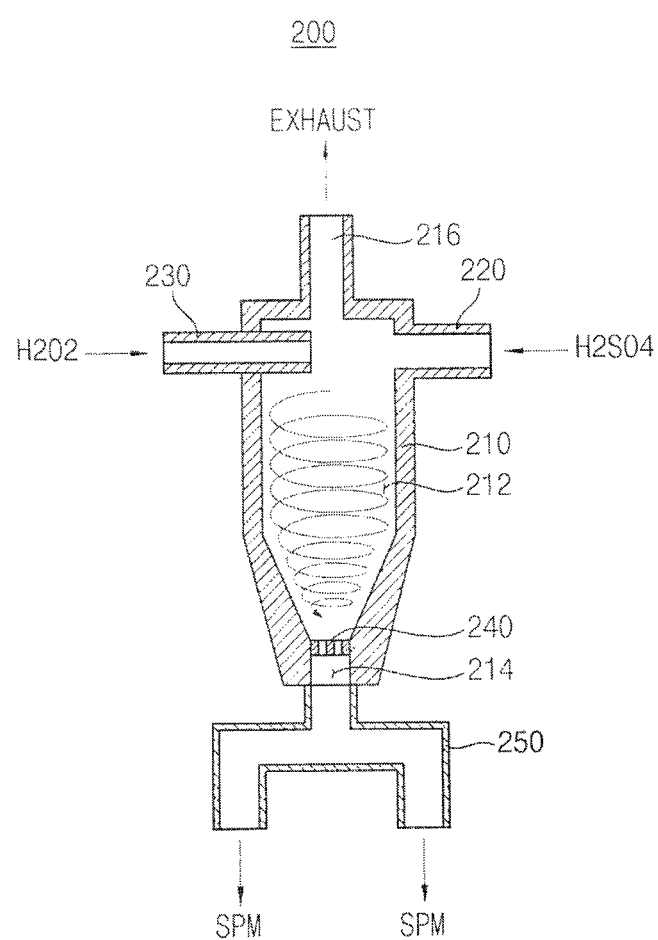
FIG. 4 is a side cross-sectional view illustrating a solution supplying unit according to still another example embodiment of the present invention.

FIG. 4 is a side cross-sectional view illustrating a solution supplying unit according to still another example embodiment of the present invention.

Referring to FIG. 4, the solution supplying unit 200 according to the present example embodiment includes a body 210, a first supplying tube 220, a second supplying tube 230, a rotating blocking part 240 and a branch tube 250.

Except for the branch tube 250, detailed explanations of the body 210, the first supplying tube 220, the second supplying tube 230 and the rotating blocking part 240 according to the present example embodiment are substantially same as those of the body 110, the first supplying tube 120, the second supplying tube 130 and the rotating blocking part 140 according to the previous example embodiment referring to FIGS. 1 to 3.

The branch tube 250 is connected to an out-flowing part 214 of the body 210, and has a plurality of branches. A diameter of the branch tube 250 may be substantially same as that of the out-flowing part 214.

Even though the rotation of the mixed solution is not totally decreased in passing through the rotating blocking part 240, the rotation of the mixed solution may be decreased again in passing through the branch tube 250. Therefore, the mixed solution may be prevented from being scattered.

In addition, the mixed solution may be flowed out through a plurality of separated positions through the branch tube 250. Thus, the mixed solution may be uniformly provided in a relatively larger area. Therefore, efficiency of treating a substrate using the mixed solution may be improved.

The solution supplying unit 200 may uniformly mix the first solution with the second solution. In addition, the mixed solution is flowed out without the rotation, so that the mixed solution may be prevented from being scattered. In addition, the mixed solution may be provided in the relatively larger area through the branch tube 250.

Figure 5:
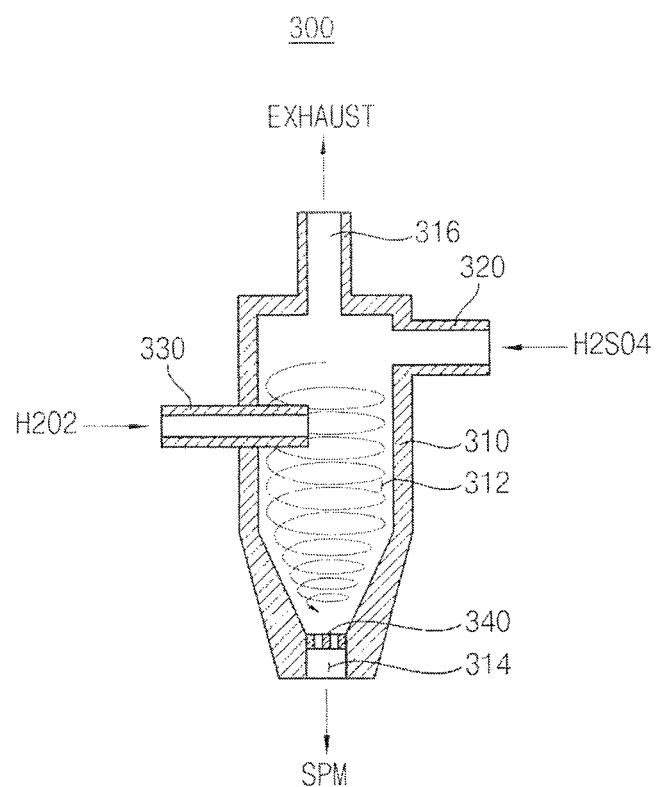
FIG. 5 is a side cross-sectional view illustrating a solution supplying unit according to still another example embodiment of the present invention.

FIG. 5 is a side cross-sectional view illustrating a solution supplying unit according to still another example embodiment of the present invention.

Referring to FIG. 5, the solution supplying unit 300 according to the present example embodiment includes a body 310, a first supplying tube 320, a second supplying tube 330 and a rotating blocking part 340.

Except for a first position of supplying the first solution through the first supplying tube 320 and a second position of supplying the second solution through the second supplying tube 330, detailed explanations of the body 310, the first supplying tube 320, the second supplying tube 330 and the rotating blocking part 340 according to the present example embodiment are substantially same as those of the body 110, the first supplying tube 120, the second supplying tube 130 and the rotating blocking part 140 according to the previous example embodiment referring to FIGS. 1 to 3.

The first position of supplying the first solution through the first supplying tube 320 is higher than a second position of supplying the second solution through the second supplying tube 330. In this case, the first solution has the specific gravity larger than the second solution. Examples of materials for the first solution may include sulfuric acid ($H_2SO_4$), and examples of materials for the second solution may include hydrogen peroxide ($H_2O_2$). Thus, the first solution moves to the bottom of the chamber 312, and the second solution moves to the top of chamber 312. Therefore, the first solution and the second solution may be uniformly mixed with each other.

Alternately, when the first solution has the specific gravity smaller than the second solution, the first solution is located at the top of chamber 312 and the second solution is located at the bottom of the chamber 312. Thus, the first solution and the second solution are stably located, so that the first solution and the second solution are not uniformly mixed with each other.

As mentioned above, since the second solution is less affected by the specific gravity and the centrifugal force of the first solution, the second solution may be easily provided into the chamber 312. Since the first solution and the second solution are provided at the different positions, the first and second solutions may be uniformly mixed with each other. In addition, the mixed solution is flowed out without the rotation through the out-flowing part 314. Thus, the mixed solution may be prevented from being scattered.

Figure 6:
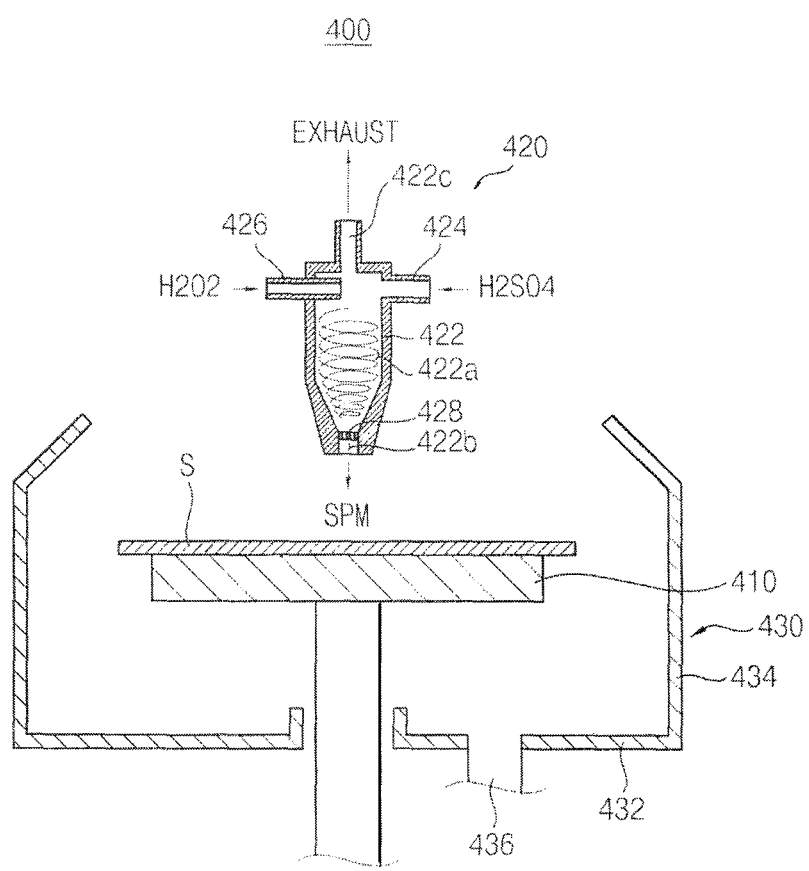
FIG. 6 is a side cross-sectional view illustrating a substrate treating apparatus according to still another example embodiment of the present invention.

FIG. 6 is a side cross-sectional view illustrating a substrate processing apparatus according to still another example embodiment of the present invention.

Referring to FIG. 6, the substrate treating apparatus 400 includes a supporting part 410, a solution supplying unit 420 and a blocking part 430.

The supporting part 410 is disposed to be rotated. A substrate S is fixed on an upper surface of the supporting part 410. Examples of the supporting part 410 may be a mechanical chuck, an electric chuck, a vacuum chuck and so on. For example, the supporting part 410 may have a circular plate shape.

A driving unit (not shown) is connected to the supporting part 410 and provides a driving force to rotate the supporting part 410.

The solution supplying unit 420 is disposed over the supporting part 410, and provides the solution to the substrate S. For example, the solution may remove a layer formed on the substrate S. The layer may include a photoresist layer. Alternatively, the solution may remove foreign substances.

The solution supplying unit 420 includes a body 422 having a chamber 422a, an out-flowing part 422b and an exhaust part 422c, a first supplying tube 424, a second supplying tube 426 and a rotating blocking part 428. The solution supplying unit 420 according to the present example embodiment is substantially same as the solution supplying unit 100 according to the previous example embodiment referring to FIGS. 1 to 3, and thus detailed explanations may be omitted. Alternatively, the solution supplying unit 420 according to the present example embodiment may be substantially same as the solution supplying unit 200 according to the previous example embodiment in FIG. 4 or the solution supplying unit 300 according to the previous example embodiment in FIG. 5.

The solution supplying unit 420 uniformly provides a mixed solution to the substrate S without scattering. An amount of solution provided to the substrate S may be accurately controlled. Thus, the photoresist layer or the foreign substances on the substrate S may be uniformly removed.

The blocking unit 430 is disposed to enclose sides of the supporting part 410, and blocks the solution scattered from a rotating substrate S. For example, blocking unit 430 has a ring-shaped cylinder with a space for receiving the supporting part 410.

The blocking unit 430 has a bottom face 432 and a side face 434. The solution blocked by the blocking unit 430 is rolled down along the side face 434, and is stayed on the bottom face 432. An out-flowing tube 436 is disposed through the bottom face 432. The solution on the bottom face 432 is flowed out through the out-flowing tube 436. The out-flowing tube 436 is connected to a solution collection unit (not shown), and the out-flowed solution may be reused.

The substrate treating apparatus 400 uniformly mixes the first solution with the second solution, and provides an accurate amount of the mixed solution to the substrate S. In addition, the amount of the mixed solution may be accurately controlled. Thus, the photoresist layer or the foreign substances of the substrate S may be uniformly removed.

According to the present invention, the solution supplying unit 420 may provide a uniformly mixed solution of sulfuric acid and hydrogen peroxide. In addition, the solution may be prevented from being scattered and the amount of the out-flowing solution may be accurately controlled. Thus, using the solution supplying unit 100, the substrate treating process such as an etching, a cleaning and so on, may be accurately performed. Thus, reliability of treating a substrate may be improved.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A solution supplying unit comprising:
a body comprising a chamber having a substantially circular cross-section to receive a solution and an out-flowing part connected to the chamber to flow out the solution;
a first supplying tube disposed at a side of the body, tangentially connected to the chamber, and configured to supply a first solution into the chamber along an inside wall of the chamber to rotate the first solution in the chamber; and
a second supplying tube having an end portion extending into the chamber, and supplying a second solution into the chamber to mix the first solution with the second solution, the end portion being formed through the body and being adjacent to a central axis of the body.

2. The solution supplying unit of claim 1, further comprising a rotating blocking part disposed in the out-flowing part to decrease a rotation of a mixed solution of the first and second solutions so that the mixed solution is prevented from being flowed out with the rotation.

3. The solution supplying unit of claim 2, wherein the rotating blocking part is a plate having a plurality of through-holes.

4. The solution supplying unit of claim 2, further comprising a branch tube connected to the out-flowing part and flowing out the mixed solution to be spaced apart from each other.

5. The solution supplying unit of claim 1, wherein the solution supplying unit has a plurality of out-flowing parts to prevent a mixed solution of the first and second solutions from being flowed out with a rotation.

6. The solution supplying unit of claim 1, wherein the body further comprises an exhaust part connected to the chamber and exhausting bubbles from the chamber to an upper portion of the chamber, and the bubbles are generated in mixing the first solution with the second solution.

7. The solution supplying unit of claim 1, wherein the first solution has a specific gravity larger than the second solution.

8. The solution supplying unit of claim 7, wherein the first solution is sulfuric acid, and the second solution is hydrogen peroxide.

9. The solution supplying unit of claim 7, wherein a first position of supplying the first solution through the first supplying tube is higher than or substantially same as a second position of supplying the second solution through the second supplying tube.

10. The solution supplying unit of claim 7, wherein a cross-sectional area of the first supplying tube is larger than that of the second supplying tube.

11. A substrate treating apparatus comprising:
a supporting part supporting a substrate on which a photoresist layer is formed; and
a solution supplying unit disposed over the supporting part to supply a solution to the substrate, the solution removing the photoresist layer,
wherein the solution supplying unit comprises:
a body comprising a chamber having a substantially circular cross-section to receive a solution and an out-flowing part connected to the chamber to flow out the solution;
a first supplying tube disposed at a side of the body, tangentially connected to the chamber, and configured to supply a first solution into the chamber along an inside wall of the chamber to rotate the first solution in the chamber; and
a second supplying tube having an end portion extending into the chamber, and supplying a second solution into the chamber to mix the first solution with the second solution, the end portion being formed through the body and being adjacent to a central axis of the body.

* * * * *